United States Patent
Kierse et al.

(10) Patent No.: US 7,667,323 B2
(45) Date of Patent: Feb. 23, 2010

(54) SPACED, BUMPED COMPONENT STRUCTURE

(75) Inventors: Oliver Kierse, Killaloe (IE); John O'Dowd, Crecora (IE); John Wynne, Lisnalty (IE); William Hunt, Castletroy (IE); Eamon Hynes, Raheen (IE); Peter Meehan, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/272,564

(22) Filed: Nov. 10, 2005

(65) Prior Publication Data

US 2006/0163726 A1    Jul. 27, 2006

Related U.S. Application Data

(60) Provisional application No. 60/627,249, filed on Nov. 12, 2004.

(51) Int. Cl.
*H01L 23/48* (2006.01)
*H01L 23/34* (2006.01)

(52) U.S. Cl. ............ 257/737; 257/E23.021; 257/E23.004; 257/E21.511; 257/778; 257/774; 257/773

(58) Field of Classification Search ............ 257/737, 257/738, 778, 774, 775, 776, E23.021, E23.004, 257/E21.511, 773
See application file for complete search history.

(56) References Cited

U.S. PATENT DOCUMENTS

| | | | |
|---|---|---|---|
| 4,807,021 A | 2/1989 | Okumura | 357/75 |
| 5,222,014 A | 6/1993 | Lin | 361/414 |
| 5,436,795 A | 7/1995 | Bishop et al. | |
| 5,561,085 A * | 10/1996 | Gorowitz et al. | 438/125 |
| 5,629,566 A * | 5/1997 | Doi et al. | 257/789 |
| 6,114,221 A * | 9/2000 | Tonti et al. | 438/455 |
| 6,175,161 B1 | 1/2001 | Goetz et al. | 257/780 |
| 6,219,254 B1 * | 4/2001 | Akerling et al. | 361/763 |
| 6,278,379 B1 | 8/2001 | Allen et al. | |
| 6,312,974 B1 * | 11/2001 | Wu et al. | 438/107 |
| 6,359,790 B1 | 3/2002 | Meyer-Berg | 361/803 |
| 6,465,786 B1 | 10/2002 | Rhodes | 250/338.4 |
| 6,472,247 B1 * | 10/2002 | Andoh et al. | 438/64 |

(Continued)

FOREIGN PATENT DOCUMENTS

DE    G 94 17 734.1    3/1995

(Continued)

OTHER PUBLICATIONS

Lahiji, G.R. et al., "A Batch-Fabricated Silicon Thermopile Infrared Detector," IEEE Transactions on Electron Devices, vol. ED-29(1), pp. 14-22 (Jan. 1982).

(Continued)

*Primary Examiner*—Alexander O Williams
(74) *Attorney, Agent, or Firm*—Sunstein Kann Murphy & Timbers LLP

(57) ABSTRACT

A spaced, bumped component structure including a first plate, a second plate spaced from the first plate by a first gap, a plurality of solder bumps interconnecting the plates and defining the first gap; at least one of the plates having an anomalous section including one of a raised platform and recess for defining a second gap having a different size from the first gap.

39 Claims, 5 Drawing Sheets

U.S. PATENT DOCUMENTS

| | | | |
|---|---|---|---|
| 6,548,315 B2 * | 4/2003 | Kohno et al. | 438/17 |
| 6,559,487 B1 * | 5/2003 | Kang et al. | 257/254 |
| 6,844,606 B2 | 1/2005 | Logsdon et al. | 257/434 |
| 6,927,490 B2 * | 8/2005 | Franzon et al. | 257/734 |
| 6,952,049 B1 * | 10/2005 | Ogawa et al. | 257/700 |
| 6,982,380 B2 * | 1/2006 | Hoffmann et al. | 174/520 |
| 7,329,871 B2 | 2/2008 | Fan et al. | 250/353 |
| 2004/0046263 A1 * | 3/2004 | Harper et al. | 257/777 |
| 2004/0125578 A1 * | 7/2004 | Konishi et al. | 361/783 |
| 2004/0188829 A1 * | 9/2004 | Hu et al. | 257/712 |
| 2004/0245624 A1 * | 12/2004 | Swanson et al. | 257/711 |
| 2005/0034888 A1 * | 2/2005 | Hoffmann et al. | 174/52.4 |
| 2005/0104187 A1 | 5/2005 | Polsky et al. | 257/690 |
| 2005/0151244 A1 * | 7/2005 | Chrysler et al. | 257/713 |
| 2005/0186705 A1 | 8/2005 | Jackson et al. | 438/106 |
| 2005/0258548 A1 * | 11/2005 | Ogawa et al. | 257/778 |
| 2006/0043555 A1 * | 3/2006 | Liu | 257/680 |
| 2006/0163453 A1 | 7/2006 | Hynes et al. | 250/214 R |
| 2007/0108635 A1 | 5/2007 | Youn | 257/787 |
| 2007/0166867 A1 | 7/2007 | Chow et al. | 438/65 |
| 2008/0074852 A1 * | 3/2008 | Lee | 361/749 |
| 2008/0116567 A1 * | 5/2008 | Amin et al. | 257/712 |

FOREIGN PATENT DOCUMENTS

| | | |
|---|---|---|
| DE | 199 30 308 A1 | 11/2001 |
| JP | P2002-39893 A | 2/2002 |
| WO | WO 98/18303 | 4/1998 |

OTHER PUBLICATIONS

Dr. rer. nat. Wildermuth-Helmer, German Office Action, Issued Nov. 25, 2008, Application No. 11 2005 002 762.7-54.

v. Bezold & Partner, Translation of Official Action, Issued Nov. 25, 2008, Application No. 11 2005 002 762.7-54.

v. Bezold & Partner, Response to Official Action, Issued Nov. 25, 2008, Application No. 11 2005 002 762.7-54, Jul. 15, 2009.

v. Bezold & Partner, English translation of amended claims from Response to Translation of Official Action, Issued Nov. 25, 2008, Application No. 11 2005 002 762.7-54, Jul. 15, 2009.

* cited by examiner

SPACED, BUMPED COMPONENT STRUCTURE

RELATED APPLICATIONS

This application claims the benefit of U.S. Provisional Application No. 60/627,249, filed Nov. 12, 2004, incorporated by reference herein.

FIELD OF THE INVENTION

This invention relates to a spaced, bumped component structure for making gap size independent of solder bump size.

BACKGROUND OF THE INVENTION

In fabrication of spaced, bumped component structures it is often necessary to control the gap size independent of the solder ball size. For example, in one pressure sensor application an integrated circuit chip is flip-chip bump bonded to a substrate. The facing surfaces of the chip and substrate may typically be metallized. A hole or recess in the other side of the substrate creates a diaphragm structure beneath the metallized surface so movement of the diaphragm due to gas or fluid pressure can be sensed by changes in capacitance between the metallized surfaces due to changes in the size of the gap between them. It is also possible to provide a diaphragm layer without the use of the said hole or recess. In such an application it is desirable to have a gap that is relatively small so that very small movements of the diaphragm may be readily detected. But typically the gap size is defined by the size or diameter of the solder bumps and the bumps are generally no smaller than 80-120 μms. This is so because generally the chip and the substrate have different coefficients of thermal expansion (CTE) e.g., chip is silicon (3-5 ppm/deg C.); substrate is alumina (6-8 ppm/deg C.). The stresses that occur during temperature cycling typically require a solder bump size greater than approximately 80-120 μms. This is but one illustration of the need to control the gap size independent of bump size. In other cases there may be no difference in CTE but the desired gap size may be larger or smaller than the bump size. Another problem with controlling gap size relates to tolerance. That is, solder bumps of 80-120 μms, for example, typically have a manufacturing tolerance of ±15 μm; not an acceptable condition when gap size and small variations in gap size are used to sense diaphragm movement, for example.

BRIEF SUMMARY OF THE INVENTION

It is therefore an object of this invention to provide an improved spaced, bumped component structure.

It is a further object of this invention to provide such an improved spaced, bumped component structure which makes the gap independent of solder bump size.

It is a further object of this invention to provide such an improved spaced, bumped component structure in which the gap can be greater or lesser than bump size.

It is a further object of this invention to provide such an improved spaced, bumped component structure which reduces the effect of manufacturing tolerances on the gap.

It is a further object of this invention to provide such an improved spaced, bumped component structure which reduces the effect of bump and support structure tolerances on gap tolerance.

It is a further object of this invention to provide such an improved spaced, bumped component structure which enables ease of registration of the components.

It is a further object of this invention to provide such an improved spaced, bumped component structure which enables ease of orientation of the components.

The invention results from the realization that an improved spaced, bumped component structure whose gap is independent of bump size can be achieved by providing at least one of two spaced plates, having a first gap defined by the bumps, with an anomalous section including at least one of a raised platform or recess for defining a second gap having a different size from the first gap. Further realizations include the use of pillars to fix the second gap and a channel for receiving the bumps such as, solder bumps to set the first gap smaller than the solder bumps. In general any conductive interconnect whose height can be controlled, such as printed conductive polymers, can be used, in place of solder bumps.

The subject invention, however, in other embodiments, need not achieve all these objectives and the claims hereof should not be limited to structures or methods capable of achieving these objectives.

This invention features a spaced, bumped component structure including a first plate, a second plate spaced from the first plate by a first gap and a plurality of solder bumps interconnecting the plates and defining the first gap. At least one of the plates has an anomalous section including one of a raised platform and recess for defining a second gap having a different size from the first gap.

In a preferred embodiment one of the plates may include an anomalous section having a raised platform and the second gap is smaller than the first gap. One of the plates may include an anomalous section having a recess and the second gap may be larger than the first gap. Each of the plates may have a raised platform or a recess. One of the plates may have a raised platform and the other a recess. The bumps may be outside the anomalous sections. The bumps may be inside the anomalous sections. The bumps may surround the anomalous sections. The at least one of the plates may include a relieved portion for partially receiving the bumps. The plates may include a conductive plate and a substrate and the conductive plate and substrate may include alumina. The plates may include an integrated circuit chip and a substrate. The integrated circuit chip may include silicon and the substrate may include alumina. The facing surfaces of the plates in the second gap may be metallized. The plates may include a well portion proximate the second gap constituting a diaphragm. The metallized facing surfaces in the second gap may effect a capacitive sensor. The metallized facing surface in the second gap may be patterned to effect a pair of coupled inductors. There may be a plurality of pillars between the plates at the anomalous section for fixing the dimension of the second gap.

This invention also features a spaced, bumped component structure including a first plate, a second plate spaced from the first plate by a first gap, a channel in at least one of the plates, and a plurality of solder bumps disposed in the channel interconnecting the plates and defining the first gap smaller than the bumps.

In a preferred embodiment at least one of the plates may have an anomalous section including one of a raised platform and recess for defining a second gap having a different size from the first gap. The one of the plates may include an anomalous section having a raised platform and the second gap may be smaller than the first gap. The one of the plates may include an anomalous section having a recess and the second gap may be larger than the first gap. Each of the plates may have a raised platform. Each of the plates may have a recess. One of the plates may have a raised platform and the other a recess. The bumps may be outside the anomalous sections. The bumps may be inside the anomalous sections. The bumps may surround the anomalous sections. The at least one of the plates may include a relieved portion for partially receiving the bumps. The plates may include a conductive plate and a substrate and the conductive plate and substrate may include alumina. The plates may include an integrated circuit chip and a substrate. The integrated circuit chip may include silicon and the substrate may include alumina. The facing surfaces of the plates in the second gap may be metallized. The plates may include a well portion proximate the second gap constituting a diaphragm. The metallized facing surfaces in the second gap may effect a capacitive sensor. The metallized facing surface in the second gap may be patterned to effect a pair of coupled inductors. There may be a plurality of pillars between the plates at the anomalous section for fixing the dimension of the second gap.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
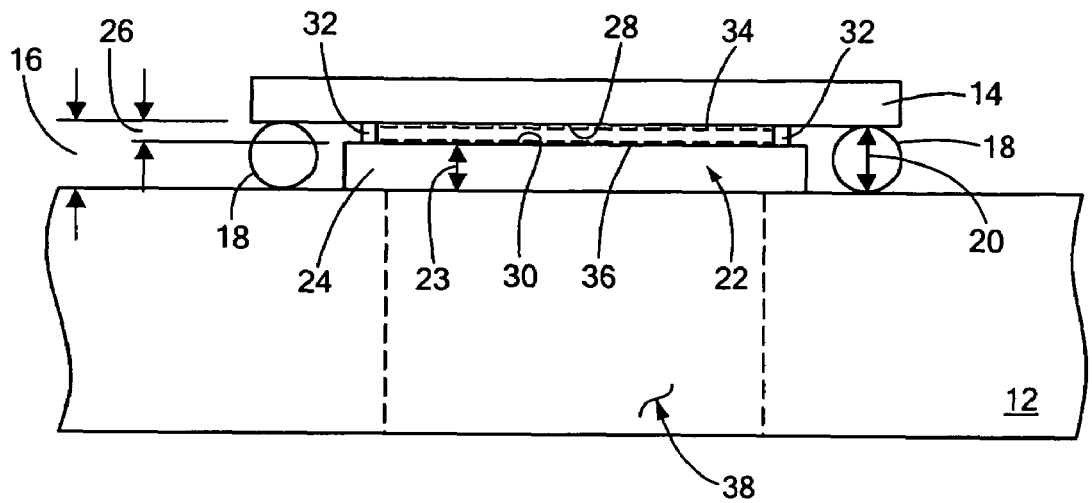
FIG. 1 is a schematic side sectional elevation view of a spaced, bumped component structure according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a spaced, bumped component structure 10 including a first plate 12 and a second plate 14 spaced from the first plate by a first gap 16 and a plurality of solder balls or bumps 18. One of the plates 12 and 14, in this case, plate 12 has an anomalous section 22 which may be a raised platform or a recess. In this case anomalous section 22 is embodied as a raised platform 24. This defines a second gap 26 having a different size than the first gap 16, thus, the second gap 26 between the lower surface 28 of second plate 14 and the upper surface 30 of platform 24 is defined and controlled not by solder balls 18 but by the height 23 of platform 24. To ensure that the dimension remains stable, pillars 32 may be used. Pillars are intended to function as the controlling mechanism for controlling the gap 26, as they will rest on the platform 24. The height 23 of platform 24 is secondary to this. The first and second plates may include a conductive plate and a substrate both of which may include alumina.

Figure 1A:
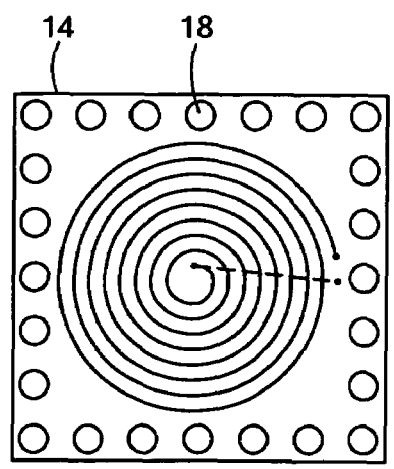
FIG. 1A is a top plan schematic view showing the metallization patterned to form coupled conductors.

In one embodiment the first plate 12 may be a substrate of alumina, for example, and second plate 14 may be an integrated circuit chip made of silicon. Surfaces 28 and 30 may be metallized at 34 and 36, respectively, to create a working capacitor in gap 26. The metallizations may be patterned to form coupled inductors, an example of which is shown in FIG. 1A. Well 38, FIG. 1, may be created clear through plate 12 essentially making platform 24 a diaphragm or well 38 could extend only partially through leaving a portion of plate 12 to form a diaphragm in combination with platform 24.

Figure 2:
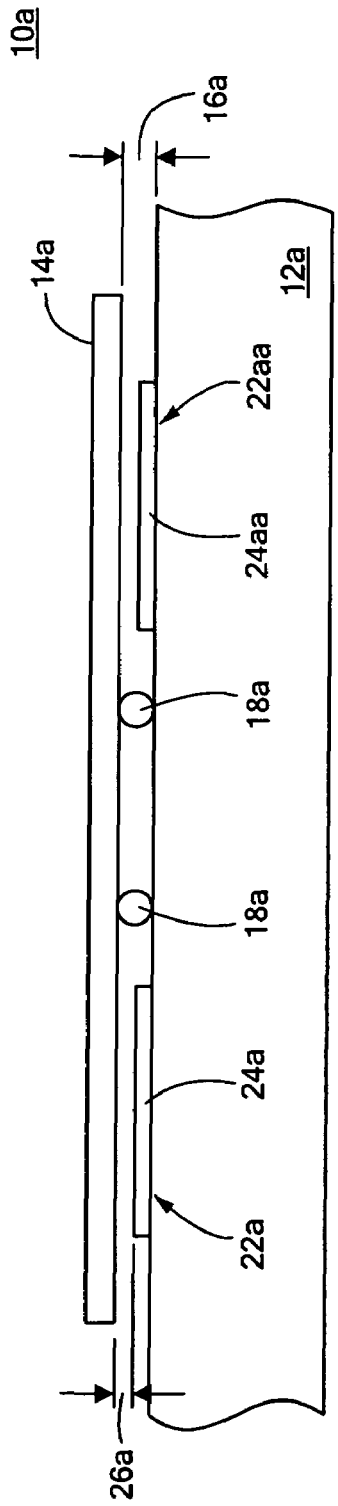
FIG. 2 is a view similar to FIG. 1 with the solder bumps inside the anomalous sections.

The efficacy of employing pillars 32 can be seen from the fact that solder bumps 18 are generally required to be between 80-120 microns with a ±15 micron tolerance, whereas pillars can be manufactured at heights as low as ten microns. The prime function of the pillar is to act as a spacing device. These may be manufactured using several methods but are typically copper plated pillars with tolerances within one micron. In practice the pillars may be copper plated onto a wafer and then bumps applied to the wafer by screen printing or ball drop. The wafer is then sawn to form individual ICs, for example IC plate 14. These are flipped onto the alumina substrate plate 12. The bumps can then be attached to the substrate either e.g. dry, or with flux, or with solder paste. The substrate plate 12 is then reflowed in an oven to melt the solder bumps, but not the pillars and form the solder joint. During this time the solder bumps collapse so that the pillars on platform 24 actually set the gap 26. Although in FIG. 1 the solder bumps are shown externally to the anomalous section 22 this is not a necessary limitation of the invention for as shown in FIG. 2 there may be more than one anomalous section 22a and 22aa which may be either raised platforms or recesses. In this case they are shown as raised platforms 24a and 24aa. Further, the solder bumps 18a may be inside of the anomalous section or sections rather than outside.

Figure 3:
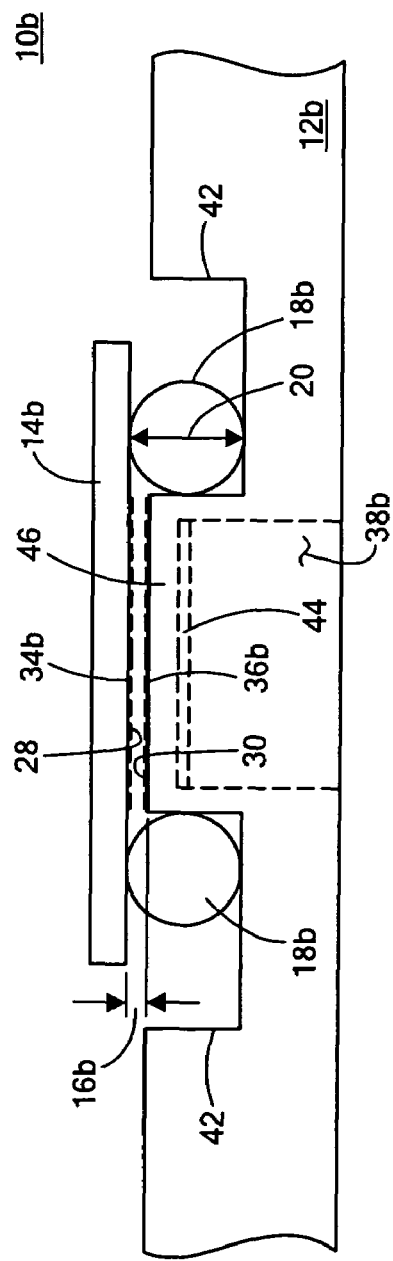
FIG. 3 is a view similar to FIG. 1 with the solder bumps in a channel or moat.

In another construction of a spaced, bumped component structure 10b, FIG. 3, according to this invention a channel or channels 42 may be provided in either plate, in this particular case, the first plate 12b, to receive solder bumps 18b whose size 20 is much larger than the desired gap 16b. By disposing solder bumps 18b in this channel or channels the size of gap 16b can be reduced to a much smaller size while the solder bumps are kept large and more capable of withstanding stresses to which they may be submitted. Also shown in FIG. 3 is the use of a metal plate 44 on the top side of well 38b opposite lower metallized finish 36b. This is for the purpose of balancing any stress that may occur in the remaining portion 46 of plate 12b above well 38b by the presence of metallized finish 36b.

Figure 4:
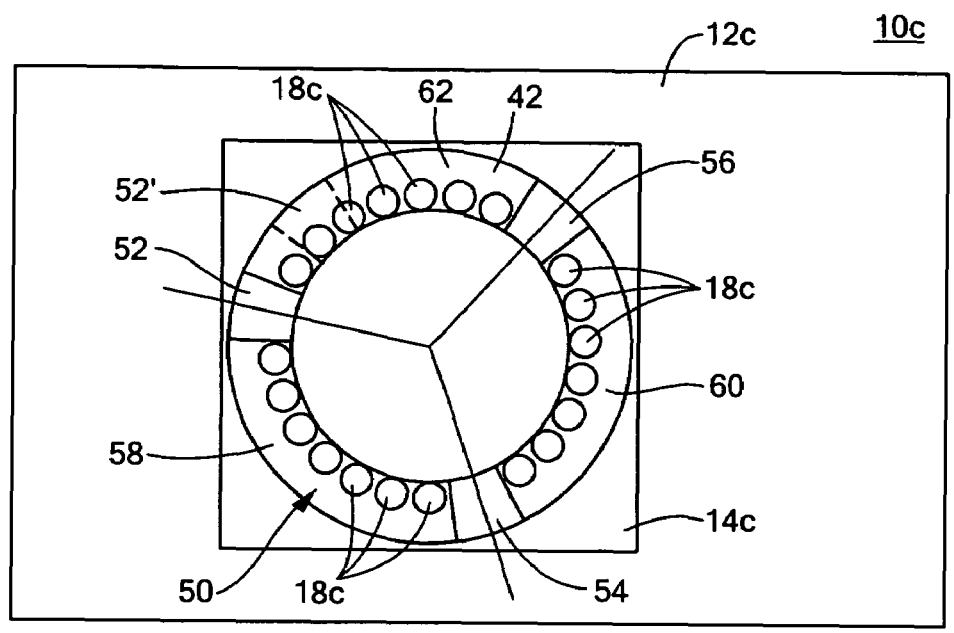
FIG. 4 is a schematic top plan view of a spaced, bumped component structure according to this invention with a circular channel or moat.

FIG. 4 shows a plan view of one arrangement of a channel 42 or channels formed actually as moat 50 around the circular raised platform 24c similar to that shown in FIG. 3. In this case tethers extend from raised platform 24c to the rest of main plate 12c. Within the three tethers 52, 54, and 56 there are created three areas 58, 60, and 62 to receive solder bumps 18c. With these solder balls or bumps 18c located against tethers 52, 54, and 56, plate 14c is prevented from rotating due to shocks and vibration. In addition, if tethers 52, 54, and 56 are not symmetrically placed, for example, at 120° spacing as shown in FIG. 4 but rather if one of them, for example, 52 is moved to the position of 52' the lack of circular symmetry ensures that the structure can only be assembled in one orientation and thereby assists in registration.

Figure 5:
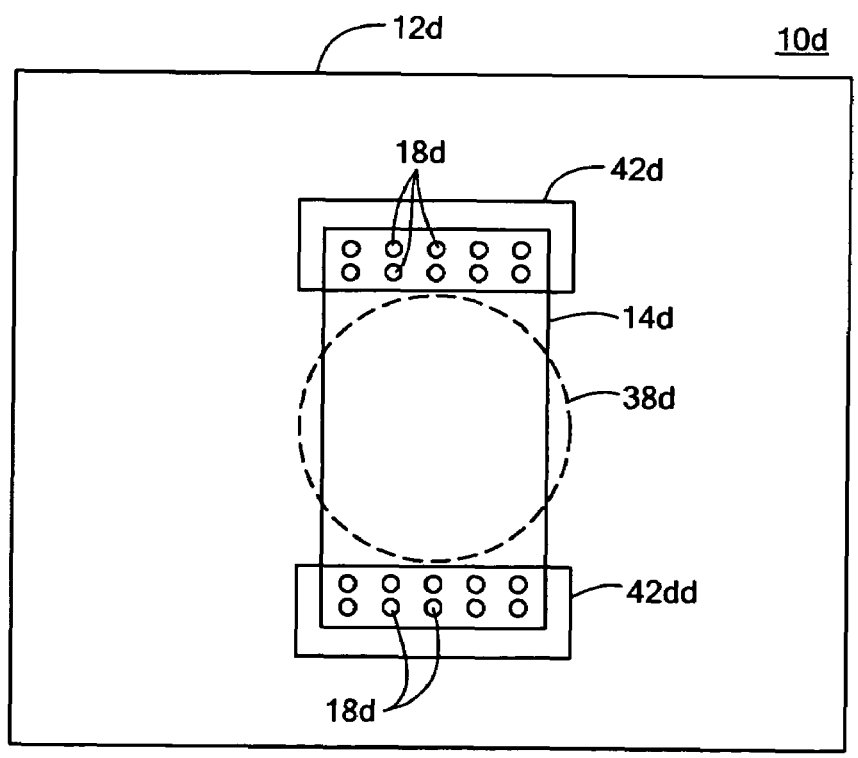
FIG. 5 is a schematic top plan view of a spaced, bumped component structure according to this invention with two separate spaced channels or moats.

Although in FIG. 4, channel 42 is shown as a moat 50 completely surrounding platform 24c this is not a necessary limitation of the invention. There may be one or more separate channels 42d, 42dd, FIG. 5. In that case well 38d may extend somewhat outside of integrated circuit chip, plate 14d.

Figure 6:
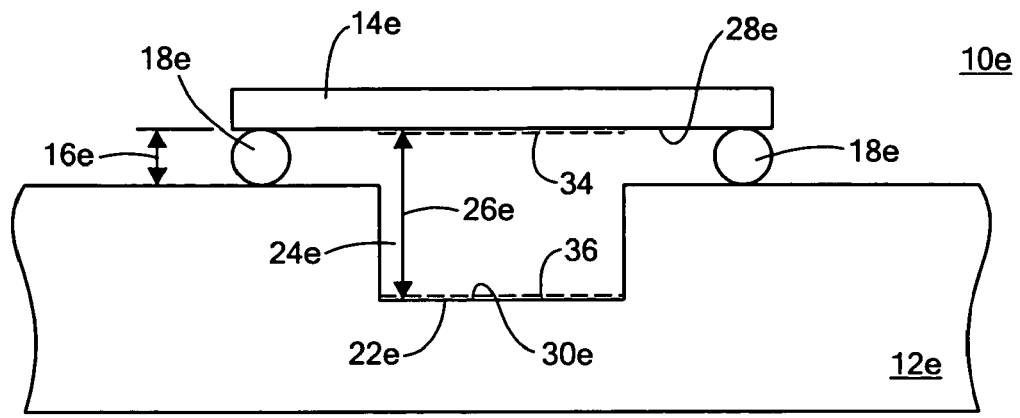
FIG. 6 is a schematic side sectional view of a spaced, bumped component structure according to this invention with an anomalous recess used for creating a diaphragm.

In some instances it may be desirable to increase the size of gap 26e relative to the size of gap 16e, FIG. 6, by making the anomalous section 22e a recess 24e. This may be desired in the case of the gas analysis system on an integrated circuit chip. It may be a requirement to allow gas to flow in a channel in front of the IC sensing surface. This could be achieved by using the arrangement shown in FIG. 6.

Figure 7:
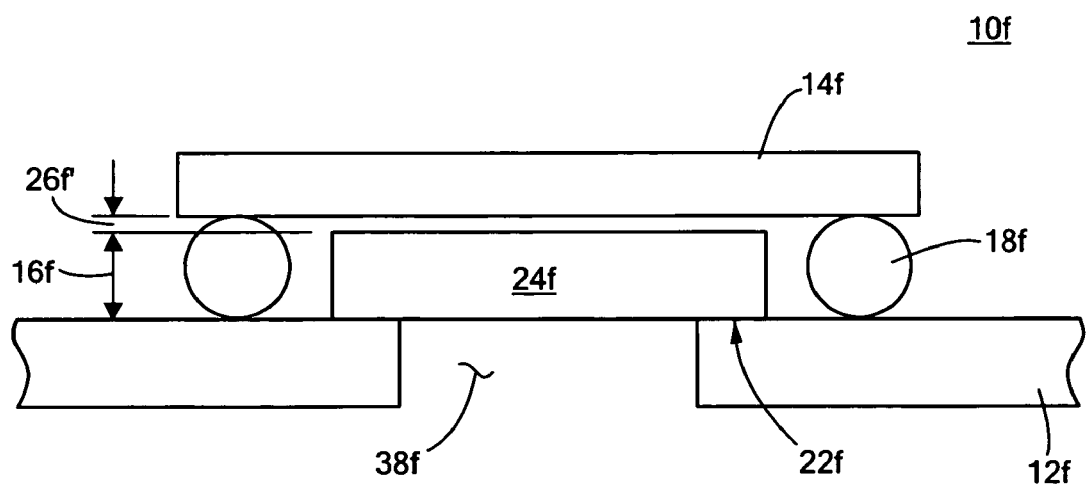
FIG. 7 is a schematic side sectional view of a spaced, bumped component structure according to this invention with a well proximate an anomalous platform for creating a diaphragm.

In another embodiment raised platform 24f, FIG. 7, of anomalous section 22f is used to control gap 26f at the same time well 38f is provided in substrate plate 12f so that platform 24f actually becomes the diaphragm which with the proper metallization as shown before can provide for a capacitive sensor in the gap 26f.

Figure 8:
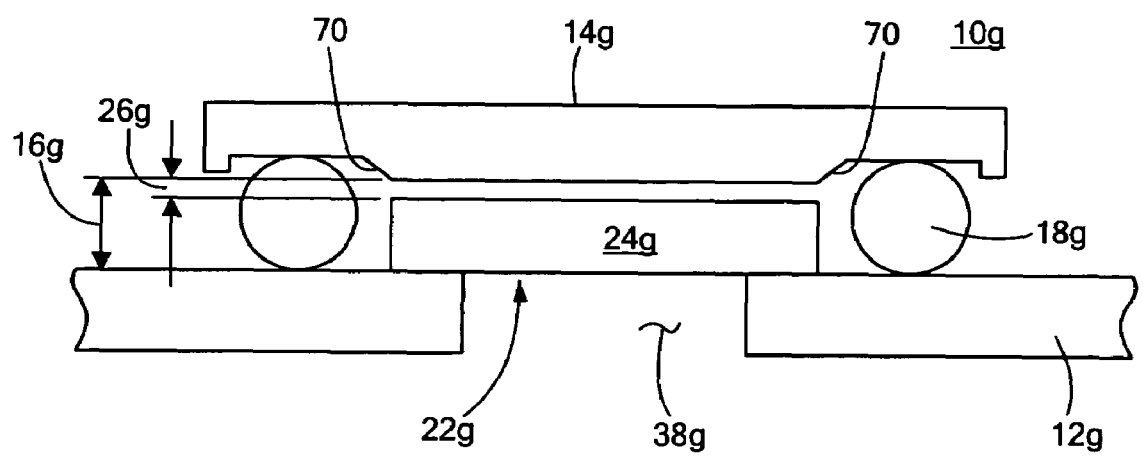
FIG. 8 is a schematic side sectional view of a spaced, bumped component structure according to this invention with a relieved portion in one of the plates for partially receiving the solder bumps.

In another construction, one of the plates 12g, 14g, FIG. 8, can have one or more relieved sections 70 to receive solder bumps 18g so that the conjunction of the diameter of the solder bump 18g, the depth of relief 70 and the height of platform 24g result in a desired gap 26g. This approach also allows the gap 26g to be less than the height of solder bump 18g. The advantage is that using typical manufacturing processes, it is easier to control the silicon etching depth of relief 70 on silicon plate 14g.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A spaced, bumped component structure comprising:
    a first plate;
    a second plate spaced from said first plate by a first gap;
    a plurality of solder bumps interconnecting said plates and defining said first gap;
    at least one of said plates having an anomalous section including one of a raised platform and recess for defining a second gap having a different size from said first gap, in which the facing surfaces of said plates in said second gap are metallized and effect one of a capacitive sensor and a pair of coupled inductors.

2. The spaced, bumped component structure of claim 1 in which said one of said plates includes an anomalous section including a raised platform and said second gap is smaller than said first gap.

3. The spaced, bumped component structure of claim 1 in which said one of said plates includes an anomalous section having a recess and said second gap is larger than said first gap.

4. The spaced, bumped component structure of claim 1 in which each of said plates has a recess.

5. The spaced, bumped component structure of claim 1 in which one of said plates has a raised platform and the other a recess.

6. The spaced, bumped component structure of claim 1 in which said bumps are outside said anomalous sections.

7. The spaced, bumped component structure of claim 1 in which said plates include more than one anomalous section and said bumps are inside said anomalous sections.

8. The spaced, bumped component structure of claim 1 in which said bumps surround said anomalous sections.

9. The spaced, bumped component structure of claim 1 in which said at least one of said plates includes a relieved portion for partially receiving said bumps.

10. The spaced, bumped component structure of claim 1 in which said first and second plates include a conductive plate and a substrate, respectively.

11. The spaced, bumped component structure of claim 10 in which said conductive plate and said substrate include alumina.

12. The spaced, bumped component structure of claim 1 in which said plates include an integrated circuit chip and a substrate.

13. The spaced, bumped component structure of claim 12 in which said integrated circuit chip includes silicon and said substrate includes alumina.

14. The spaced, bumped component structure of claim 1 in which one of said plates includes a well portion proximate said second gap constituting a diaphragm.

15. The spaced, bumped component structure of claim 1 in which said metallized facing surfaces in said second gap effect a capacitive sensor.

16. The spaced, bumped component structure of claim 1 in which said metallized facing surfaces in said second gap are patterned to effect a pair of coupled inductors.

17. The spaced, bumped component structure of claim 1 further including a plurality of pillars between said plates at said anomalous section for fixing the dimension of said second gap.

18. A spaced, bumped component structure comprising:
    a first plate;
    a second plate spaced from said first plate by a first gap;
    a channel in at least one of said plates; and
    a plurality of solder bumps disposed in said channel interconnecting said plates and defining said first gap smaller than said bumps in which the facing surfaces of said plates in said first gap are metallized and effect at one of a capacitive sensor or a pair of coupled inductors.

19. The spaced, bumper component structure of claim 18 in which at least one of said plates has an anomalous section including one of a raised platform and recess for defining a second gap having a different size from said first gap.

20. The spaced, bumped component structure of claim 18 in which said one of said plates includes an anomalous section having a raised platform for defining a second gap that is smaller than said first gap.

21. The spaced, bumped component structure of claim 18 in which said one of said plates includes an anomalous section having a recess for defining a second gap that is larger than said first gap.

22. The spaced, bumped component structure of claim 18 in which each of said plates has a recess.

23. The spaced, bumped component structure of claim 18 in which one of said plates has a raised platform and the other a recess.

24. The spaced, bumped component structure of claim 19 in which said bumps are outside said anomalous sections.

25. The spaced, bumped component structure of claim 19 in which said plates include more than one anomalous section and said bumps are inside said anomalous sections.

26. The spaced, bumped component structure of claim 19 in which said bumps surround said anomalous section.

27. The spaced, bumped component structure of claim 18 in which said at least one of said plates includes a relieved portion for partially receiving said bumps.

28. The spaced, bumped component structure of claim 18 in which said plates include a conductive plate and a substrate.

29. The spaced, bumped component structure of claim 28 in which said conductive plate and said substrate include alumina.

30. The spaced, bumped component structure of claim 18 in which said plates include an integrated circuit chip and a substrate.

31. The spaced, bumped component structure of claim 30 in which said integrated circuit chip includes silicon and said substrate includes alumina.

32. The spaced, bumped component structure of claim 19 in which one of said plates includes a well portion proximate said second gap constituting a diaphragm.

33. The spaced, bumped component structure of claim 19 in which said metallized facing surfaces in said second gap effect a capacitive sensor.

34. The spaced, bumped component structure of claim 19 in which said metallized facing surfaces in said second gap are patterned to effect a pair of coupled inductors.

35. The spaced, bumped component structure of claim 19 further including a plurality of pillars between said plates at said anomalous section for fixing the dimension of said second gap.

36. A spaced, bumped component structure comprising:
a first plate comprising a conductive plate;
a second plate comprising a substrate and spaced from said first plate by a first gap, the conductive plate and said substrate comprising alumina;
a plurality of solder bumps interconnecting said plates and defining said first gap;
at least one of said plates having an anomalous section including one of a raised platform and recess for defining a second gap having a different size from said first gap.

37. A spaced, bumped component structure comprising:
a first plate;
a second plate spaced from said first plate by a first gap, wherein the plates include an integrated circuit chip comprising silicon, and a substrate comprising alumina;
a plurality of solder bumps interconnecting said plates and defining said first gap;
at least one of said plates having an anomalous section including one of a raised platform and recess for defining a second gap having a different size from said first gap.

38. A spaced, bumped component structure comprising:
a first plate;
a second plate spaced from the first plate by a first gap, wherein the plates include a conductive plate comprising alumina and a substrate comprising alumina;
a channel in at least one of the plates; and
a plurality of solder bumps disposed in said channel interconnecting the plates and defining said first gap smaller than said bumps.

39. A spaced, bumped component structure comprising:
a first plate;
a second plate spaced from the first plate by a first gap, wherein the plates comprise an integrated circuit chip comprising silicon, and a substrate comprising alumina;
a channel in at least one of the plates; and
a plurality of solder bumps disposed in said channel interconnecting said plates and defining said first gap smaller than said bumps.

* * * * *

UNITED STATES PATENT AND TRADEMARK OFFICE
CERTIFICATE OF CORRECTION

PATENT NO. : 7,667,323 B2  Page 1 of 1
APPLICATION NO. : 11/272564
DATED : February 23, 2010
INVENTOR(S) : Oliver Kierse et al.

It is certified that error appears in the above-identified patent and that said Letters Patent is hereby corrected as shown below:

In Col. 6, line 66
delete "at"

In Col. 7, line 1
replace "bumper"
with --bumped--

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO.         : 7,667,323 B2                                                Page 1 of 1
APPLICATION NO.    : 11/272564
DATED              : February 23, 2010
INVENTOR(S)        : Oliver Kierse et al.

It is certified that error appears in the above-identified patent and that said Letters Patent is hereby corrected as shown below:

Title page (*) Notice

Delete "by 0 days" – and insert --by 160 days--

Signed and Sealed this

Twenty-fourth Day of August, 2010

David J. Kappos
*Director of the United States Patent and Trademark Office*